United States Patent [19]
Stanton et al.

[11] Patent Number: 6,144,109
[45] Date of Patent: Nov. 7, 2000

[54] METHOD FOR IMPROVING A STEPPER SIGNAL IN A PLANARIZED SURFACE OVER ALIGNMENT TOPOGRAPHY

[75] Inventors: William A. Stanton; Phillip G. Wald; Kunal R. Parekh, all of Boise, Id.

[73] Assignee: Micron Technology, Inc., Boise, Id.

[21] Appl. No.: 09/502,925

[22] Filed: Feb. 11, 2000

Related U.S. Application Data

[62] Division of application No. 09/088,322, Jun. 1, 1998, which is a division of application No. 08/887,547, Jul. 3, 1997.

[51] Int. Cl.[7] .................................................. H01L 23/544
[52] U.S. Cl. ............................................................ 257/797
[58] Field of Search .............................. 257/797; 438/401, 438/462, 975

[56] References Cited

U.S. PATENT DOCUMENTS

| | | |
|---|---|---|
| 4,389,534 | 6/1983 | Winterling . |
| 5,160,957 | 11/1992 | Ina et al. . |
| 5,528,372 | 6/1996 | Kawashima . |
| 5,532,871 | 7/1996 | Hashimoto et al. . |
| 5,541,037 | 7/1996 | Hatakeyama et al. . |
| 5,578,519 | 11/1996 | Cho ........................................... 437/67 |
| 5,639,687 | 6/1997 | Roman et al. . |
| 5,700,732 | 12/1997 | Jost et al. ................................. 438/401 |
| 5,719,072 | 2/1998 | Sugiura et al. . |
| 5,731,234 | 3/1998 | Chen . |
| 5,760,483 | 6/1998 | Bruce et al. . |
| 5,847,468 | 12/1998 | Nomura et al. .......................... 257/797 |
| 5,895,259 | 4/1999 | Carter et al. ............................. 438/563 |
| 5,925,937 | 7/1999 | Jost et al. ................................. 257/797 |
| 5,933,743 | 8/1999 | New et al. ............................... 257/797 |
| 5,969,428 | 10/1999 | Nomura et al. .......................... 257/797 |
| 6,046,094 | 4/2000 | Jost et al. ................................. 257/797 |
| 6,060,785 | 5/2000 | New et al. ............................... 257/797 |

*Primary Examiner*—David Hardy
*Assistant Examiner*—Lourdes Cruz
*Attorney, Agent, or Firm*—Trask Britt

[57] ABSTRACT

A method and resulting structure for reducing refraction and reflection occurring at the interface between adjacent layers of different materials in a semiconductor device, assembly or laminate during an alignment step in a semiconductor device fabrication process. The method comprises forming a planar-surfaced layer of material, having a first index of refraction, over a substrate of the semiconductor device, assembly or laminate. A corrective layer is formed over the planar-surfaced layer and a second layer, having a second index of refraction, is then formed over the corrective layer. The corrective layer is composed of a material having an intermediate index of refraction between the first index of refraction and the second index of refraction. The method can also be modified to include one or more layers of materials and/or intermediate refraction layers interposed between or above any of the aforementioned adjacent layers. The aforementioned method and resulting structures can be further modified by forming an additional layer of material, having the requisite intermediate index of refraction, over an uppermost layer to further reduce reflection occurring at the interface between the uppermost layer and air. The invention is also directed to semiconductor devices, assemblies or laminates formed through the aforementioned methods and incorporating the aforementioned structures.

22 Claims, 5 Drawing Sheets

METHOD FOR IMPROVING A STEPPER SIGNAL IN A PLANARIZED SURFACE OVER ALIGNMENT TOPOGRAPHY

CROSS REFERENCE TO RELATED APPLICATION

This application is a divisional of application Ser. No. 09/088,322, filed Jun. 1, 1998, pending, which is a divisional of application Ser. No. 08/887,547, filed Jul. 3, 1997, pending.

BACKGROUND OF THE INVENTION

1. Field of the Invention

The present invention relates generally to a method for improving the signal strength of light reflected from a buried topographical grating in a semiconductor device or assembly and the resulting semiconductor devices formed thereby. More specifically, the invention relates to an improved method for reducing reflection caused by differences in the refractive index at the interfaces of adjacent layers of two or more layers overlying a topographical substrate grating in a semiconductor device by inserting therebetween a layer of material having a refractive index intermediate the refractive indexes of the previously-adjacent layers of materials to provide greater signal strength to the grating and back to a detector of the stepper.

2. State of the Art

Increased integration and density of modern semiconductor integrated circuits requires increasing the accuracy of alignment-based operations and patterning processes. Specifically, resolution and alignment accuracy are basic performance requirements in alignment and exposure apparatuses used in the field of manufacturing semiconductor devices. For example, precise position alignment (i.e., "mask alignment") is required each time a mask pattern is reduced in size and transferred to a silicon wafer, other substrate of silicon, or other semiconductor material by optical reduction-photolithographic techniques. Likewise, a precise position alignment is required where a laser trimming apparatus is used to cut sections or levels of the semiconductor on a semiconductor device pattern. These requirements, coupled with the ongoing tendency to further miniaturization and higher capacity of semiconductor devices, have demanded further improvements in the resolution and alignment accuracy used in today's semiconductor manufacturing processes.

During the manufacturing process, movement of the device or expansion and contraction of a device pattern often produces differences between locations resident in a design-based coordinate system of a device pattern (hereinafter "coordinate system") and execution according to the coordinate system by an apparatus responsible for a fabrication step, such as a laser trimming apparatus. That is, unless the coordinate system of the device pattern on the silicon wafer coincides with that actually employed by the fabrication apparatus, it is impossible for the fabrication apparatus to properly align itself onto a precise position on the wafer and to carry out patterning, additive, or subtractive steps in the manufacturing process. For example, where a laser trimming apparatus is used to cut a fuse on a device pattern, the misalignment of the laser trimming apparatus results in an improperly-aligned fuse position, a variation which ultimately results in a cutting failure.

To make an operation executed by the fabrication apparatus precisely coincide with the coordinate system, a plurality of alignment marks is typically formed on the device pattern. Each of the alignment marks is constructed of a highly reflective material, such as aluminum, and is surrounded by a field region devoid of reflective material.

Alternatively, where alignment is to an underlying layer (e.g. substrate) topography, a layer of reflective material is deposited over a grating that has been etched into the semiconductor substrate.

In conventional alignment methods utilizing the aforementioned alignment marks or reflective layer, the device pattern is scanned with light of varying wavelengths emanating from an alignment apparatus (e.g., a laser beam) along an x- or y- axis of the coordinate system. Variation in the amount of light reflected vertically from the alignment mark or reflective layer is then detected each time the alignment apparatus scans the area overlying an alignment mark or reflective layer. In this manner, the position of each of the alignment marks or a specific area of the reflective layer is detected. Based on the detected coordinates of the alignment marks or reflective layer areas, the position of the fabrication apparatus or device pattern is adjusted so that the fabrication apparatus is positioned precisely at a point that coincides with the coordinate system of the device pattern.

During the manufacturing process, the alignment marks (or reflective layer) are generally covered with one or more layers of light-transmissive materials, such as polysilicon, resist, insulator, and combinations of other suitable and known films. These intervening layered materials create optical interference with the beam of light traveling between the alignment apparatus and the alignment mark during alignment steps in subsequent phases of the fabrication process. Specifically, as light passes through the interface between two thin-film layers of dielectric, non-absorbing materials having different indexes of refraction, reflection of the light passing therethrough increases. This reflective effect increases as the difference between the indexes of refraction between two adjacent layers increases.

Reflection can cause alignment problems by reducing the incident light signal reaching the reflective layer or alignment marks. Additionally, when the light signal is reflected from the reflective layer or the alignment marks back to the alignment apparatus, the strength and resolution of the light signal is further decreased as the signal undergoes additional reflection when it passes through each interface between adjacent layers of overlying material. Several solutions have been proposed in the prior art to solve the above-mentioned problems associated with alignment inaccuracies due to reflection in semiconductor devices. For example, various alignment systems for use with projection (photoresist) exposure apparatus have utilized an alignment light, having a wavelength that is different from that of an exposing light and that is within the visible wavelength region, in order to enable observation of a wafer surface during the alignment procedure.

Another proposed solution involves formation of a transparent anti-reflective film on a top surface of a resist layer and peeling the film after exposure in order to form a fine resist pattern to high dimensional and alignment accuracies. The use of a low index of refraction material as the anti-reflective film results in a reduction of reflected light at the interface between the resist layer and anti-reflective film, thus improving the dimensional accuracy of a resist image. An alternative method requires removal of a portion of a cover film deposited over the alignment marks to eliminate reflection caused by the cover film.

Other proposed approaches have involved modification of an optical system used with the projection exposure apparatus. For instance, U.S. Pat. No. 5,532,871 to Hashimoto et al. discloses a two-wavelength antireflection film consisting of alternately laminated layers of low and intermediate refractive index materials which are applied to the faces of the mirrors and lenses of an optical system.

Although the aforementioned methods eliminate a number of alignment problems which occur as a result of reflection between the layered materials, these methods also possess a number of shortcomings. For example, the inclusion of anti-reflective layers or films is limited to the top surface of the uppermost layer (usually a resist in the case of photolithography processes). While this approach does provide a more defined light signal, it does not necessarily improve overlay accuracy of the geometries which are patterned from level to level during the fabrication process. Other previously-identified methods require specialized fabrication steps (e.g., removal of the portion of film covering the alignment mark) and equipment, which requirements result in increased fabrication costs and production times.

In view of the foregoing limitations, there is a need in the semiconductor art for an improved method of reducing reflection of light caused by changes in the refractive index at the interface(s) of layered materials in a semiconductor device during the alignment step in semiconductor processing and fabrication. More particularly, there is a need for an improved method for reducing the aforementioned reflection in a semiconductor device or assembly having a substrate topographical grating.

SUMMARY OF THE INVENTION

The present invention is directed to a method for improving alignment to underlying topography in a semiconductor device or assembly during an alignment step in a semiconductor device fabrication process. The method comprises forming a thin, corrective layer of material between layers of material which would otherwise be mutually adjacent, hereinafter termed "process" layers for clarity. A "thin" layer is any layer of material which is substantially thinner than the adjacent process layers of materials. Process layers comprise layers of material exhibiting differing refractive indexes, which are applied on a planar surface overlying a topographical substrate grating during a semiconductor device fabrication process, and which would normally lie, after application, in mutually adjacent relationship. The thin, corrective layer is selected from a material having an index of refraction which lies between the indexes of refraction of the materials forming the process layers. The thin, corrective layer is deposited at a specific thickness, which varies depending on the wavelength of the light signal being used and the index of refraction of the corrective layer being used, to maximize transmittance of the stepper signal.

In another embodiment, there is disclosed a method for improving the alignment image intensity emanating from an alignment mark or other reflective surface (target indicia), deposited on a topographical substrate grating in a multi-layered semiconductor device, during an alignment process. The method comprises inserting a thin, corrective layer of material at the interface between two or more process layers of material which would otherwise be mutually adjacent. The thin, corrective layer is made of a material having an intermediate index of refraction relative to the indexes of refraction of the materials forming the process layers.

One particular embodiment of the improved method comprises depositing a layer of reflective material over a topographical grating surface of a substrate of the semiconductor device or assembly. A layer of material having a planar surface is formed over the topographical substrate grating surface. A first process layer of material, having a first index of refraction, is then formed over the planar-surfaced layer. A corrective layer is formed over the first process layer and a second process layer, having a second index of refraction, is then formed over the corrective layer. The corrective layer is composed of a material having an index of refraction that lies between the first index of refraction and the second index of refraction.

Where structures including additional material process layers are involved, the method can further comprise forming a second corrective layer, made from a material having a second intermediate index of refraction, over the second process layer. A third process layer having a third index of refraction, is then formed over the second corrective layer. The second intermediate index of refraction lies between the third index of refraction and the second index of refraction.

The present method can also be modified to include additional layers of materials comprising refraction modification layers interposed between or above any of the aforementioned process layers. Likewise, any of the aforementioned structures can be further modified by forming an additional layer of material, having the requisite intermediate index of refraction, over an uppermost process layer to further reduce reflection occurring at the interface between the uppermost process layer and air.

The invention is also directed to semiconductor devices formed through the aforementioned methods.

BRIEF DESCRIPTION OF THE SEVERAL VIEWS OF THE DRAWINGS

While the specification concludes with claims particularly pointing out and distinctly claiming that which is regarded as the present invention, the advantages of this invention can be more readily ascertained from the following description of the invention when read in conjunction with the accompanying drawings in which:

DETAILED DESCRIPTION OF THE INVENTION

Figure 1:
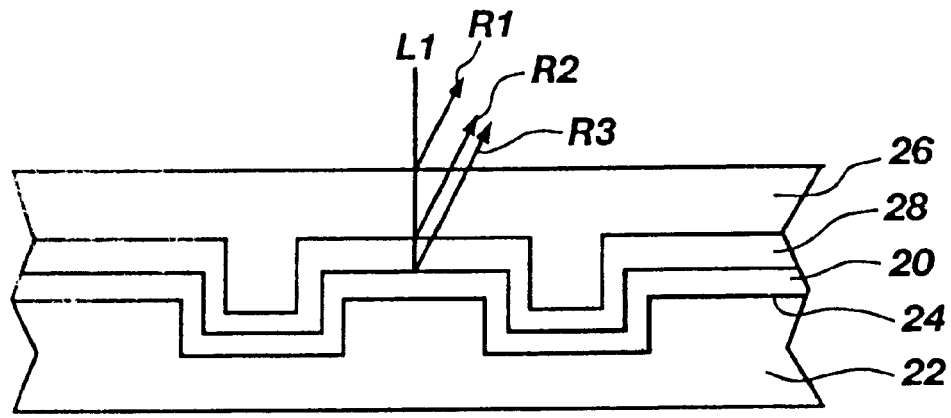
FIG. 1 is a cross-sectional view of a prior art structure illustrating reflection of light signals from a reflective layer disposed over a topographical grating on the surface of a substrate.
Figure 2:
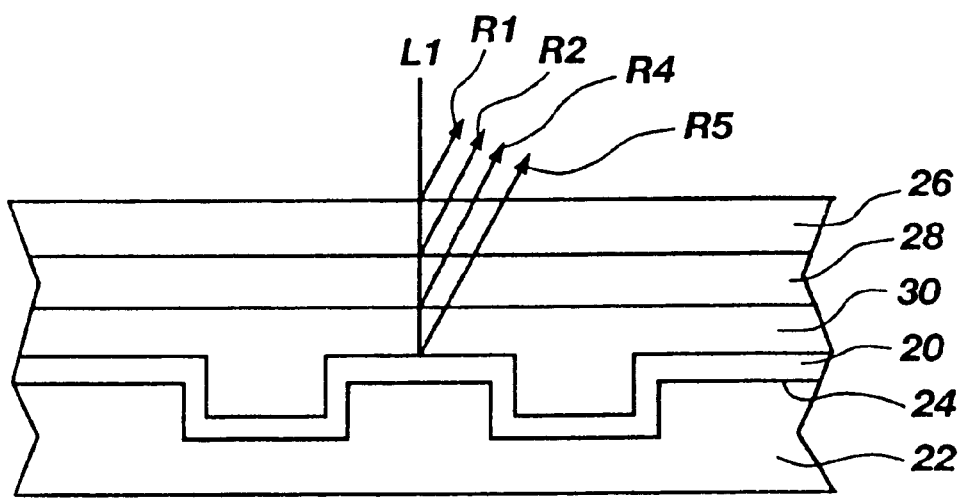
FIG. 2 is a cross-sectional view of a second prior art structure illustrating the reflection of light signals through a planar-surfaced layer disposed over a reflective layer overlying a topographical substrate grating.

Referring to FIGS. 1 through 4, it is described how the formation of corrective layers of materials according to the principles of the present invention reduces reflection and optical scattering of a light source reflected from a position-detecting area, target indicia, or alignment mark. FIGS. 1 and 2 illustrate two representative prior art structures in which a reflective layer 20, made of a material possessing high reflectivity (e.g., aluminum and alloys thereof), is formed on a top surface 24 of a substrate 22. The top surface 24 of the substrate 22 includes a topographical grating, typically formed by etching of the top surface 24. It is noted that the topographical grating, as shown throughout the figures herein, is not drawn to scale as the widths are actually much larger than the heights as shown. These prior art structures are shown in order to more fully describe the novelty of the present invention.

FIG. 1 illustrates one embodiment of the prior art structure wherein a position-detecting target or reflective layer 20 is formed on the top surface 24 of the substrate 22. Where the position-detecting target consists of a reflective layer which covers only portions of the top surface 24 of the substrate 22, the substrate 22 is preferably made of a material having low reflectivity or anti-reflective properties in order to increase the resolution of the light signal being reflected from the portions of the reflective layer.

Typically, as shown in FIG. 1, the top surface 24 of the substrate 22 is coated with a thin layer of material possessing high reflectivity.

Although the present embodiment includes the aforementioned reflective layer 20, it is understood that the present structure can exclude the use of the reflective layer 20 and rely instead on reflection of the beam of light LI directly from the grated top surface 24 of the substrate 22 to create a signal to carry out various alignment processes. This alternative process is particularly well suited where detection of varying topography underlying the light-penetrated layers is sought.

As previously mentioned, reflection is caused by differences in the indexes of refraction of the materials forming normally-adjacent process layers in the instant structures. An increase in the difference between the indexes of refraction of adjacent process layers produces an increase in the reflected intensity at the interface between the adjacent process layers. Specifically, this reflection causes a substantial loss of intensity and resolution of the light L1 traveling vertically downward before it reaches the reflective layer 20. Reflection of the light signal also interferes with intensity and phase information traveling vertically upwards from the reflective layer 20 by decreasing the intensity and resolution of the light L1 reaching the alignment apparatus (e.g., optical elements in a stepper).

During the alignment procedure, the beam of light L1 emanating from the alignment apparatus undergoes substantial reflection R1 at the interface between a first process layer 26, which typically consists of a layer of resist material, and the air above the process layer 26 (the air-process layer interface). The light L1 passing through the first process layer 26 once again undergoes reflection R2 at the interface between the first 20 process layer 26 and a second process layer 28 (first process layer-second process layer interface), which typically consists of polysilicon. The light undergoes reflection R3 a third time at the interface between the second process layer 28 and the reflective layer 20 (the second process-reflective layer interface) or, alternatively, at the interface between the second process layer 28 and the top surface 24 of the substrate 22 (the second process layer-substrate interface) where a reflective layer or alignment mark is not included. In this fashion. a reflected portion of light L1 exits through the first process layer 26 as emergent light signals R1, R2, and R3, thus causing optical interference.

FIG. 2 shows a second embodiment of a prior art structure which is identical to the structure of FIG. 1, except that a planar-surfaced layer 30 is formed over the reflective layer 20. The planar-surfaced layer 30 can comprise any material having good insulative and light-transmissive characteristics, such as boro-phospho-silicate glass (BPSG). As described with respect to the embodiment of FIG. 1, a portion of light L1 exits through the first process layer 26 as emergent light signals R1, R2, and R3. However, due to the presence of the planar-surfaced layer 30, emergent light signal R3 is replaced by emergent light signals R4 and R5 reflected from the interface between the second process layer 28 and the planar-surfaced layer 30 (second process layer-planar layer interface) and from the interface between the planar-surfaced layer 30 and the reflective layer 20 (planar layer-retlective layer interface), respectively.

Incorporation of the planar-surfaced layer 30 allows for tight process control for all levels while decreasing the required number of masking steps. However, highly reliable alignment is still problematic as semiconductor devices and assemblies become smaller in dimension and, as a result, possess more critical alignment tolerances. The differential in index of refraction between two adjacent materials, such as that seen between a planar-surfaced layer 30 made of BPSG and a second process layer 28 made of polysilicon, creates reflection at the second process layer-planar layer interface, which leads to signal interference and signal strength reduction.

Figure 3:
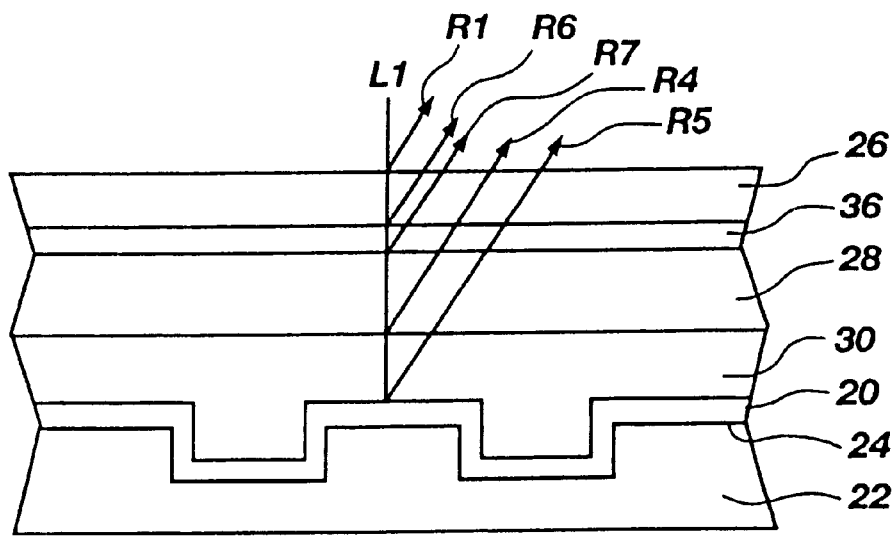
FIG. 3 is a cross-sectional view of a semiconductor device made in accordance with the principles of the present invention and illustrating the reduction of reflection due to the formation of a corrective layer between two process layers.

FIG. 3 illustrates a preferred embodiment of a structure formed according to the principles of the present invention in which a corrective layer 36 is formed over the second process layer 28. For purposes of simplicity, elements common to FIGS. 1 and 2 will hereinafter be numbered identically in subsequent figures. FIG. 3 is representative of the structure depicted in FIG. 2, with the addition of a thin corrective layer. The provision of a corrective layer 36 is effective for reducing the reflection R2 (FIG. 2) occurring at the first process layer-second process layer interface.

This reduction in reflection occurs even though the light L1 now passes through two interfaces, the interface between the first process layer 26 and the corrective layer 36 (first process layer-corrective layer interface) and the interface between the corrective layer 36 and the second process layer 28 (corrective layer-second process layer interface).

This reduced-reflection effect is due to the fact that the combination of emergent light signal R6 from the first process layer-corrective layer interface and emergent light signal R7 from the corrective layer-second process layer interface is of lower intensity than the emergent light signal R2 of FIG. 1 (i.e., R6+R7<R2).

Where the material which forms the first process layer 26 has a first index of refraction $n_1$ and the material which forms the second process layer 28 has a second index of refraction $n_2$, the corrective layer 36 is made from a material having an intermediate index of refraction $n_1$ that lies between the first and second indexes of refraction $n_1$ and $n_2$ (i.e. $n_1 > n_i > n_2$, or $n_1 < n_i < n_2$). For example, where the first process layer 26 is made of a resist material having a first index of refraction $n_1$ of about 1.7, and the second process layer 28 is made of a polysilicon material, having a second index of refraction $n_2$ of 3.9, suitable materials for use as the corrective layer 36 include any dielectric, non-absorbing, light-transmissive materials having an index of refraction lying between 1.7 and 3.9. Two such suitable materials for the corrective layer include silicon nitride and barium-lithium alloys.

Preferably, the corrective layer 36 is made from a material having an index of refraction equal to the square root of the product of the first and second indexes of refraction $n_1$ and $n_2$ (i.e., $(n_1 \times n_2)^{1/2}$) for maximum reduction of reflection at the first process layer-second process layer interface (prior to the formation of the corrective layer 36 therebetween) and to maximize the signal strength of the light L1 reaching and being reflected from the reflective layer 20.

The thickness of the material forming the corrective layer 36 also affects the intensity and resolution of the light LI being transmitted through the semiconductor device or assembly. Two key variables affecting such transmittance are the wavelength $\lambda$ of the light L1 being utilized in the alignment step and the index of refraction $n_i$ of the corrective layer 36. The desired corrective layer 36 thickness $t_i$ to reduce reflection from surfaces can be calculated in accordance with the following equation, where m is a positive integer:

$$t_i = m\lambda/4n_i$$

Preferably, m has a value of one (1) in order to form the thinnest possible layer, so that a semiconductor device or assembly having the smallest possible dimensions can be formed.

It is recognized that some limitations may exist with respect to formation of the thinnest possible layer. These limitations may be a result of, for example, limitations inherent in the deposition apparatus or the formation methodology being used, as well as limitations in the single-layer thickness achievable with relation to the selected material or compound, or an inability to efficiently or cost-effectively deposit or form such a thin corrective layer with the apparatus or methodology being used. In such cases, the corrective layer 36 can be deposited or formed to have a greater thickness than that observed when an "m" value of one (1) is used. Although the corrective layer 36 formed by this method can have a thickness that is based on an integral multiple of $t_i$ (i.e., where m equals 2, 3, 4, etc., in the aforementioned equation), a "thin" corrective layer 36, which is substantially thinner than the adjacent layers of materials, is desirably formed or deposited.

For example, where the corrective layer 36 is formed between a first process layer 26 made of a resist material, having a first index of refraction $n_1$ of 1.7, and a second process layer 28 made of a polysilicon material, having a second index of refraction $n_2$ of 3.9, the index of refraction $n_i$ of the corrective layer 36 preferably has a value of 2.6 (as calculated according to the aforementioned equation). If the light L1 being applied is an ultraviolet light with a wavelength of 300 nm, an optimal "thin" corrective layer 36 will have a thickness of about 28.9 nm. Where application of such a thin layer is impractical (or if impossible due to the fabrication apparatus or methodology), the corrective layer 36 can be formed or deposited to have a thickness equal to a multiple of 28.9 nm (i.e., 57.8 nm, 86.7 nm, 115.6 nm, etc.) to provide the thinnest practically implementable layer.

Figure 4:
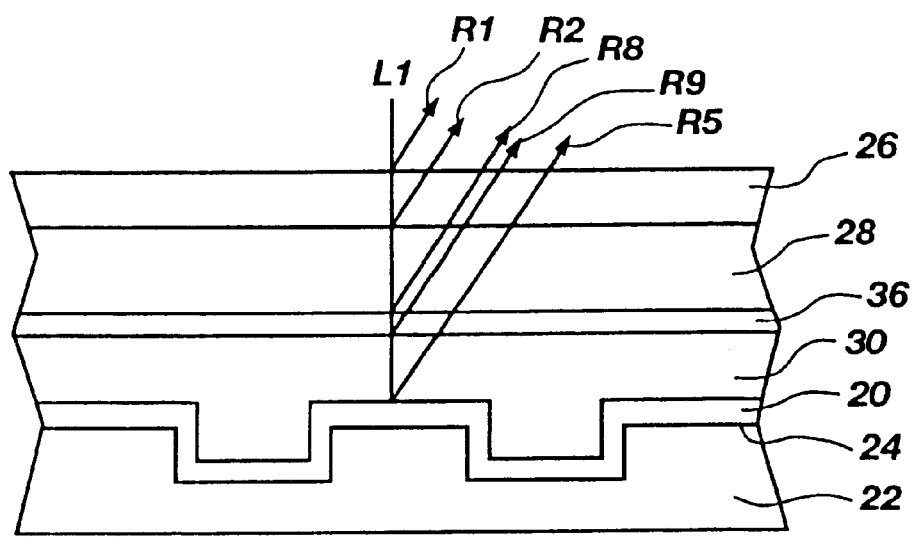
FIG. 4 is a cross-sectional view of a semiconductor device of FIG. 3, illustrates the reduction of reflection due to the formation of a corrective layer between a planar-surfaced layer and a process layer.

FIG. 4 illustrates a preferred embodiment of a structure formed according to the principles of the present invention wherein the corrective layer 36 is formed at the second process layer-planar layer interface (FIG. 2). The provision of the corrective layer 36 is effective for reducing the emergent light signal R4 normally occurring at the second process layer-planar layer interface (FIG. 2). As described above with respect to FIG. 3, the reduction in reflection is due to the fact that the combination of emergent light signal R8 reflected from the interface between the second process layer 26 and the corrective layer 36 and the emergent light signal R9 reflected from the interface between the corrective layer 28 and the planar-surfaced layer 30 is of lower intensity than the emergent light signal R4 of FIG. 2 (i.e., R8+R9<R4). Thus, formation of the corrective layer 36 reduces the intensity of multiple refractive light signals produced in a typical prior art structure, which, in turn, decreases optical interference when conducting alignment to underlying semiconductor device or assembly topography.

The intermediate index of refraction $n_i$ of the corrective layer 36 lies between the second index of refraction $n_2$ and a third index of refraction $n_3$ of a material forming the planar-surfaced layer 30 (i.e., $n_2 > n_i > n_3$, or $n_2 < n_i < n_3$). Preferably, the corrective layer 36 is made from a material having an index of refraction equal to the square root of the product of the second and third indexes of refraction $n_2$ and $n_3$ (i.e., $(n_2 \times n_3)^{1/2}$)

Figure 5:
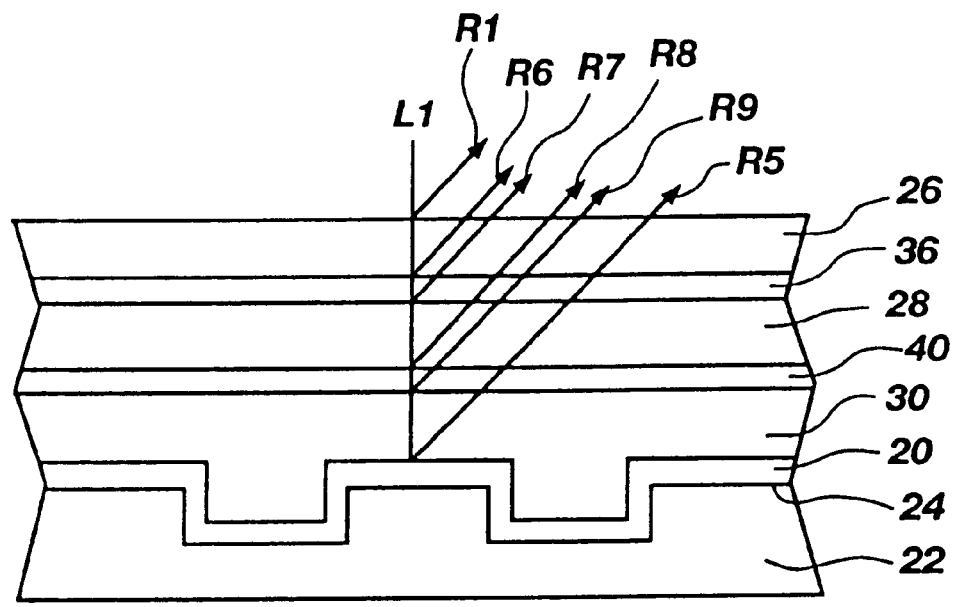
FIGS. 5–9 illustrate the reduction in reflection due to the formation of corrective layers in various embodiments of the semiconductor devices made in accordance with the principles of the present invention.

FIG. 5 shows a modified embodiment of the structures of FIG. 3 wherein a second corrective layer 40 is further disposed or formed over the planar-surfaced layer 30. Consistent with the principles of the invention, the second corrective layer 40 is made of a material having a second intermediate index of refraction $n_{i2}$ that lies between the second index of refraction $n_2$ of the second process layer 28 and the third index of refraction $n_3$ of the planar-surfaced layer 30 (i.e., $n_2 > n_{i2} > n_3$, or $n_2 < n_{i2} < n_3$). In the present embodiment, the second corrective layer 40 can be made of a different material than that used to form the corrective layer 36 disposed between the first process layer 26 and the second process layer 28. However, it is understood that the second corrective layer 40 and the corrective layer 36 can also be made of the same material, so long as the index of refraction of the material used therein lies between the index of refraction of the materials adjacent to the corrective layers 36 or 40.

As a result, the combination of emergent light signals R6 and R7 (reflected from the first process layer-corrective layer interface and the corrective layer-second process layer interface, respectively) and emergent light signals R8 and R9 (reflected from the second process layer-second corrective layer interface and the second corrective layerplanar layer interface, respectively) is of lower intensity than the emergent light signals R2 and R4 that would be reflected from the first process layer-second process layer interface and second process layer-planar layer interface, respectively (FIG. 2).

Figure 6:
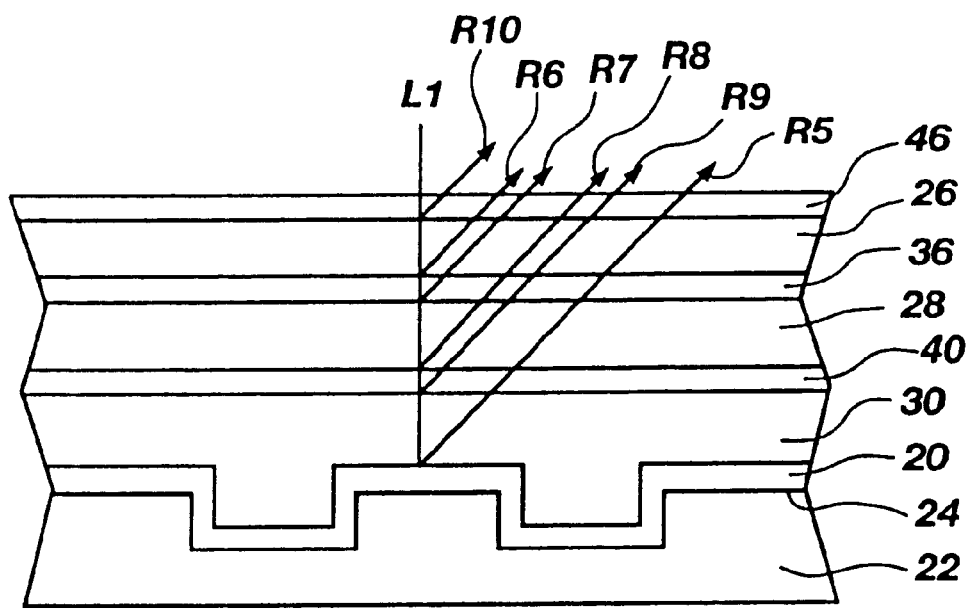

FIG. 6 shows yet another preferred embodiment of a structure made according to the method of the present invention. FIG. 6 shows a modified embodiment of the structure of FIG. 5, wherein a third corrective layer 46 is deposited or formed over the first process layer 26. The third corrective layer 46 is made of a material having an index of refraction that lies between the first index of refraction $n_1$ of the first process layer 26 and the index of refraction of air. The formation of the third corrective layer 46 results in an emergent light signal R10 that is of lower intensity than the emergent light signal R1 (FIGS. 1–5) typically reflected from the air-process layer interface. While this particular embodiment has been illustrated with reference to the structure of FIG. 6, it is understood that the deposition of a corrective layer over an uppermost process layer can be employed in any of the various embodiments illustrated throughout this description.

Figure 7:
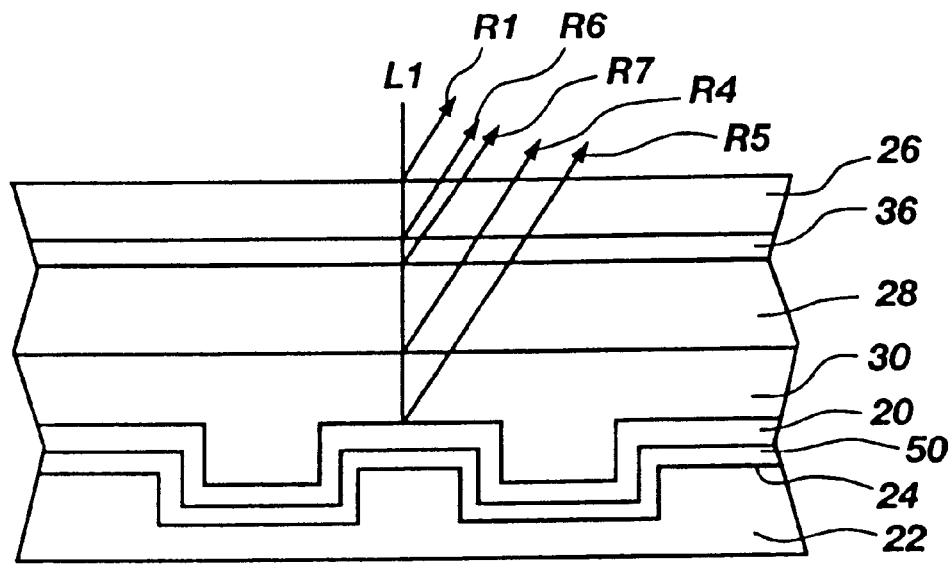
Figure 8:
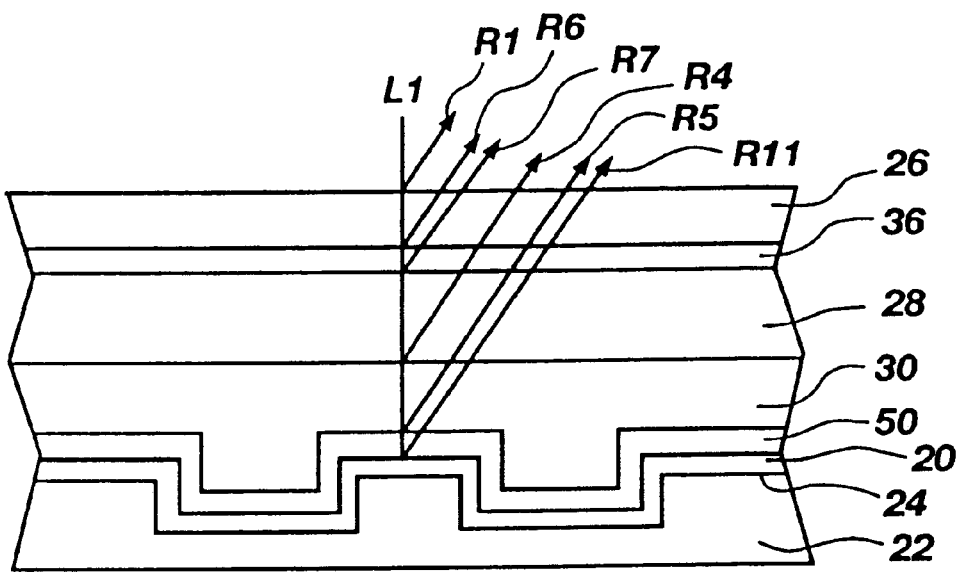

FIG. 7 illustrates a modified embodiment of the structure of FIG. 3 wherein a combination stack of layers 50 is deposited or formed between the reflective layer 20 and the top surface 24 of the substrate 22. The combination stack of layers 50 comprise any combination of conformal films or layers typically deposited in a process flow. In the instant embodiment, alignment is made to the underlying topography as delineated by the reflective layer 20 overlying the combination stack of layers 50. As shown in FIG. 8, the combination stack of layers 50 and the reflective layer 20 can be transposed so that the combination stack of layers 50 is disposed over the reflective layer 20. In this case, the combination stack of layers 50 comprise a plurality of process layers having light25 transmissive characteristics. For purposes of simplicity, a single light signal $R_{11}$ is shown to depict all of the various combinations of reflections occurring in the combination stack.

Figure 9:
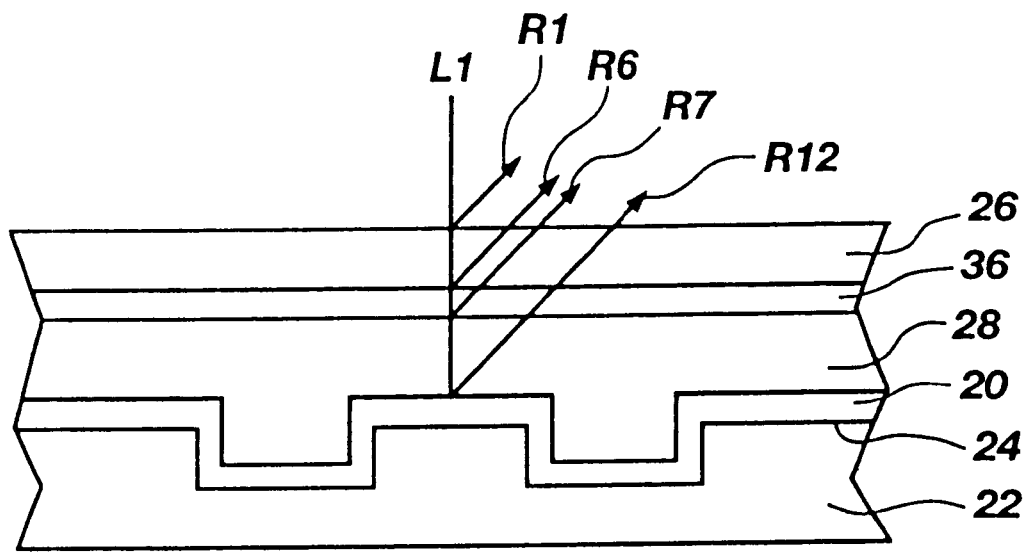

FIG. 9 illustrates yet another modified embodiment of the structure of FIG. 3 wherein the second process layer 28 is deposited or formed as a planar-surfaced layer directly over the reflective layer 20. This embodiment eliminates the step of forming the planar-surfaced layer 30, as described with reference to FIG. 3, thus reducing the overall thickness of the semiconductor device or assembly and simplifying the method of fabrication. The instant embodiment further reduces the number of reflective signals emanating from the device or assembly (i.e., emergent light signals R4 and R5 from FIG. 3 are now replaced by emergent light signal R12 reflected from the reflective layer-second process layer interface).

Although the preferred embodiments of the present invention have been disclosed for illustrative purposes, those skilled in the art will appreciate that various modifications, additions, and substitutions are possible, without departing from the scope and spirit of the invention as disclosed in the accompanying claims.

What is claimed is:

1. A semiconductor device structure having reduced refraction at the interface formed between adjacent layers of different materials, the semiconductor device structure formed by the method comprising:

providing a base layer having a non-planar surface;

forming a planar-surfaced layer over the non-planar surface of the base layer, the planar-surfaced layer having a first index of refraction;

forming a corrective layer over the planar-surfaced layer, the corrective layer having an intermediate index of refraction; and forming a process layer over the corrective layer, the process layer having a second index of refraction, wherein the intermediate index of refraction lies between the first index of refraction and the second index of refraction.

2. The structure of claim 1, wherein providing the non-planar surface comprises forming a substrate having a base layer having a non-planar top surface.

3. The structure of claim 2, wherein providing a base layer having a non-planar surface further comprises forming a reflective layer over the non-planar top surface of the substrate.

4. The structure of claim 2, wherein providing a base layer having a non-planar surface further comprises forming at least one layer of material over the non-planar top surface of the substrate.

5. The structure of claim 4, wherein providing a base layer having a non-planar surface further comprises forming a reflective layer over the at least one layer of material.

6. The structure of claim 1, wherein forming the planar-surfaced layer comprises forming a planar-surfaced polysilicon layer.

7. The structure of claim 1, wherein forming the planar-surfaced layer comprises forming a base planar-surfaced layer over the non-planar surface and forming a second layer over the base planar-surfaced layer.

8. The structure of claim 7, wherein forming the base planar-surfaced layer comprises forming an insulator layer.

9. The structure of claim 8, wherein the insulator layer is boro-phospho-silicate glass.

10. The structure of claim 7, wherein the second layer is a polysilicon layer.

11. The structure of claim 7, wherein the base planar-surfaced layer has a third index of refraction and the second layer has a fourth index of refraction, the assembly further comprising forming a second corrective layer between the base planar-surfaced layer and the second layer, the second corrective layer having an index of refraction that lies between the third index of refraction and the fourth index of refraction.

12. The structure of claim 11, wherein the second corrective layer is formed to have a thickness that is smaller than a thickness of the base planar-surfaced layer and a thickness of the second layer.

13. The structure of claim 11, wherein the second corrective layer is silicon nitride.

14. The structure of claim 11, wherein the second corrective layer is barium-lithium.

15. The structure of claim 11, wherein the corrective layer is formed to have a thickness that is smaller than a thickness of the planar-surfaced layer and a thickness of the process layer.

16. The structure of claim 11, wherein the corrective layer is silicon nitride.

17. The structure of claim 11, wherein the corrective layer is barium-lithium.

18. The structure of claim 11, wherein forming the process layer comprises forming a resist layer.

19. The structure of claim 11, further comprising forming a third corrective layer over the process layer, the third corrective layer having an index of refraction that lies between an index of refraction of air and the second index of refraction.

20. A semiconductor device structure having improved alignment to at least one underlying non-planar layer of material in a multi-layered semiconductor device or assembly, the semiconductor device structure formed by the method comprising forming at least one corrective layer of material at the interface of one or more process layers overlying the at least one non-planar layer of material, the corrective layer of material having an intermediate index of refraction relative to the index of refraction of the materials forming the adjacent layers.

21. The structure of claim 20, further comprising forming a top corrective layer over an uppermost layer of the multi-layered semiconductor device or assembly, the top corrective layer having a second intermediate index of refraction that lies between the index of refraction of air and a top-layer index of refraction.

22. The structure of claim 20, wherein the corrective layer is formed to have a thickness that is smaller than the thickness of the adjacent layers.

* * * * *

UNITED STATES PATENT AND TRADEMARK OFFICE
CERTIFICATE OF CORRECTION

PATENT NO. : 6,144,109
DATED : November 7, 2000
INVENTOR(S) : William A. Stanton, Phillip G. Wald and Kunal R. Parekh It is certified that error appears in the above-identified patent and that said Letters Patent is hereby corrected as shown below:

Title page,
Item [56], References Cited, U.S. PATENT DOCUMENTS, before "11/1996" insert -- * --, before "12/1998" insert -- * --; before "4/1999" insert -- * --; before "4/2000" insert -- * --; before "5/2000" insert -- * --; insert -- * cited by examiner --

Column 5,
Line 28, change "LI" to -- L1 --
Line 55, delete "20"

Column 8,
Line 25, change "$n_2$" (second occurrence) to -- $n_{i2}$ --
Line 40, change "layerplanar" to -- layer-planar --

Column 9,
Line 9, change "light25 transmissive" to -- light-transmissive --
Line 10, change "$R_{11}$" to -- R11 --
Line 34, before "interface" change "the" to -- an --
Line 36, before "method" change "the" to -- a --
Line 54, after "surface" insert -- of the base layer --
Line 59, after "the" and before "substrate" insert -- base layer of the --

Column 10,
Line 16, change "assembly" to -- method --

Signed and Sealed this

Seventeenth Day of May, 2005

JON W. DUDAS
*Director of the United States Patent and Trademark Office*